United States Patent
Cai et al.

(10) Patent No.: US 10,153,371 B2
(45) Date of Patent: Dec. 11, 2018

(54) SEMICONDUCTOR DEVICE WITH FINS INCLUDING SIDEWALL RECESSES

(71) Applicants: STMICROELECTRONICS, INC., Coppell, TX (US); GLOBALFOUNDRIES Inc., Grand Cayman (KY)

(72) Inventors: Xiuyu Cai, Niskayuna, NY (US); Qing Liu, Watervliet, NY (US); Ruilong Xie, Schenectady, NY (US)

(73) Assignees: STMICROELECTRONICS, INC., Coppell, TX (US); GLOBALFOUNDRIES INC, Grand Cayman (KY)

( * ) Notice: Subject to any disclaimer, the term of this patent is extended or adjusted under 35 U.S.C. 154(b) by 117 days.

(21) Appl. No.: 14/175,215

(22) Filed: Feb. 7, 2014

(65) Prior Publication Data
US 2015/0228781 A1    Aug. 13, 2015

(51) Int. Cl.
*H01L 29/78* (2006.01)
*H01L 29/66* (2006.01)

(52) U.S. Cl.
CPC ...... *H01L 29/785* (2013.01); *H01L 29/66545* (2013.01); *H01L 29/66795* (2013.01); *H01L 29/7848* (2013.01)

(58) Field of Classification Search
CPC ......... H01L 21/76224; H01L 29/66795; H01L 29/41791; H01L 29/785; H01L 29/7853
See application file for complete search history.

(56) References Cited

U.S. PATENT DOCUMENTS

| | | | |
|---|---|---|---|
| 8,310,013 B2 | 11/2012 | Lin et al. | |
| 8,334,185 B2 | 12/2012 | Kronholz et al. | |
| 8,450,194 B2 | 5/2013 | Waite et al. | |
| 2004/0108523 A1* | 6/2004 | Chen | H01L 29/41791 257/202 |
| 2008/0277740 A1* | 11/2008 | Tateshita | H01L 21/28123 257/396 |
| 2010/0025743 A1 | 2/2010 | Hoentschel et al. | |
| 2010/0038679 A1* | 2/2010 | Chan | H01L 29/66795 257/190 |
| 2012/0153402 A1 | 6/2012 | Kronholz et al. | |
| 2012/0161238 A1 | 6/2012 | Scheiper et al. | |
| 2012/0211838 A1 | 8/2012 | Kronholz et al. | |
| 2012/0267683 A1 | 10/2012 | Kronholz et al. | |
| 2013/0001698 A1 | 1/2013 | Waite et al. | |
| 2013/0095627 A1 | 4/2013 | Flachowsky et al. | |
| 2013/0175585 A1 | 7/2013 | Tan et al. | |

(Continued)

*Primary Examiner* — Lex Malsawma
*Assistant Examiner* — Geoffrey Ida
(74) *Attorney, Agent, or Firm* — Seed IP Law Group LLP

(57) ABSTRACT

A method is for making a semiconductor device. The method may include forming fins above a substrate, each fin having an upper fin portion including a first semiconductor material and a lower fin portion including a dielectric material. The method may include forming recesses into sidewalls of each lower fin portion to expose a lower surface of a respective upper fin portion, and forming a second semiconductor layer surrounding the fins including the exposed lower surfaces of the upper fin portions. The second semiconductor layer may include a second semiconductor material to generate stress in the first semiconductor material.

20 Claims, 6 Drawing Sheets

(56) References Cited

U.S. PATENT DOCUMENTS

| | | | |
|---|---|---|---|
| 2013/0234204 A1* | 9/2013 | Kang | H01L 29/7851 |
| | | | 257/190 |
| 2013/0248985 A1 | 9/2013 | Amarnath et al. | |
| 2013/0285138 A1 | 10/2013 | Vega et al. | |
| 2013/0320449 A1 | 12/2013 | Hoentschel et al. | |
| 2013/0320450 A1 | 12/2013 | Hoentschel et al. | |
| 2014/0061734 A1* | 3/2014 | Basker | H01L 29/66795 |
| | | | 257/288 |
| 2015/0035069 A1* | 2/2015 | Hung | H01L 27/1211 |
| | | | 257/369 |

\* cited by examiner

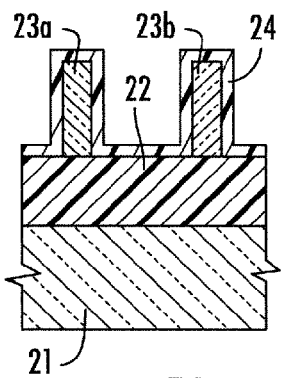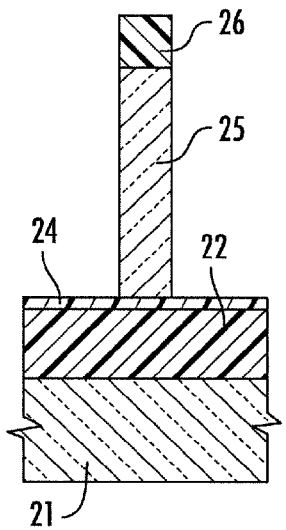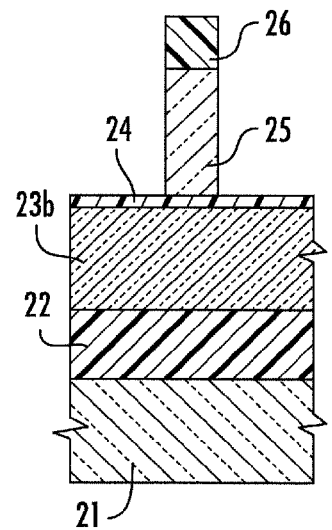
FIG. 5A  FIG. 5B  FIG. 5C
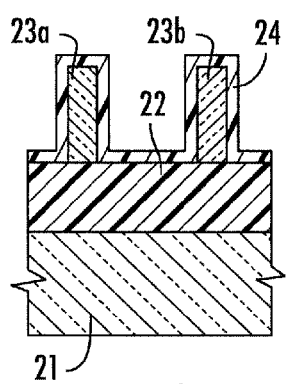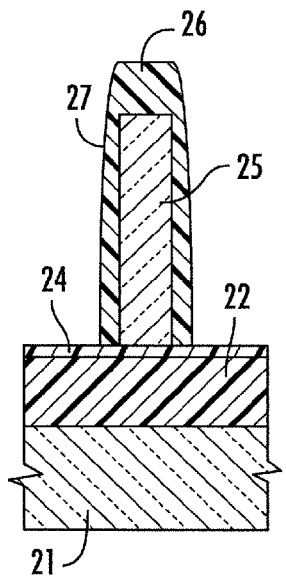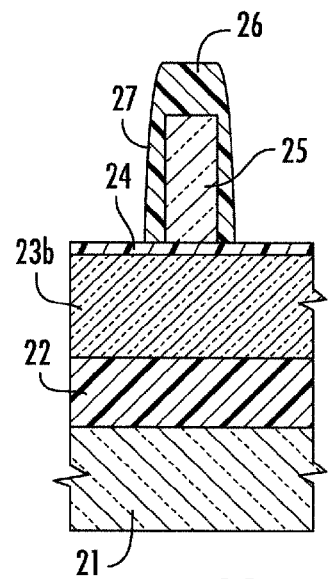
FIG. 6A  FIG. 6B  FIG. 6C

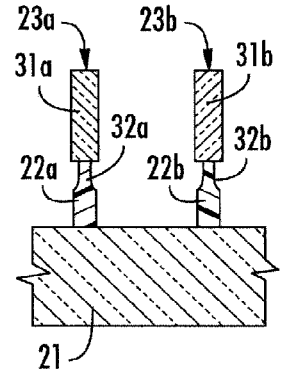 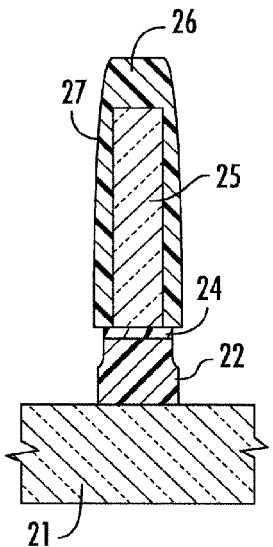 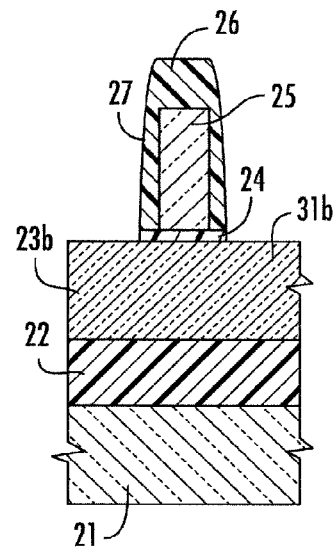
FIG. 7A     FIG. 7B     FIG. 7C
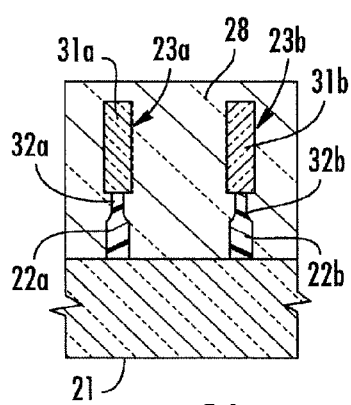 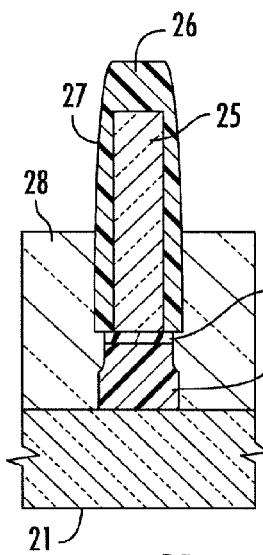 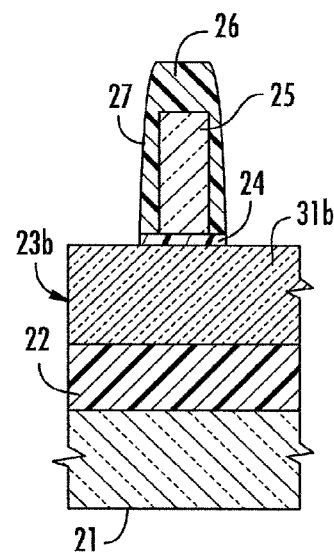
FIG. 8A     FIG. 8B     FIG. 8C

US 10,153,371 B2

SEMICONDUCTOR DEVICE WITH FINS INCLUDING SIDEWALL RECESSES

JOINT RESEARCH AGREEMENT

The subject matter claimed herein was made as a result of activities undertaken within the scope of a joint research agreement. The parties to the joint research agreement are (1) STMicroelectronics, Inc., (2) International Business Machines Corporation, and (3) Globalfoundries Inc.

TECHNICAL FIELD

The present disclosure relates to the field of electronic devices and, more particularly, to semiconductor devices and related methods.

BACKGROUND

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

One example FINFET device is disclosed in U.S. Pat. No. 8,310,013 to Lin et al. The FINFET device includes a substrate of a crystalline semiconductor material having a top surface of a first crystal plane orientation, a fin structure of the crystalline semiconductor material overlying the substrate, a gate structure over a portion of the fin structure, and an epitaxial layer over another portion of the fin structure. The epitaxial layer has a surface with a second crystal plane orientation. The epitaxial layer and underlying fin structure include a source and drain region. The source region is separated from the drain region by the gate structure. A channel is defined in the fin structure from the source region to the drain region, and aligned in a direction parallel to both the surface of the epitaxial layer and the top surface of the substrate. Despite the existence of such configurations, further enhancements in FINFET devices may be desirable in some applications, particularly next generation devices with relatively small dimensions.

Another approach to a FINFET device 200 is shown in FIG. 1. The FINFET device 200 includes a substrate 205, a dielectric layer 206 on the substrate, and first and second fins 202*a*-202*b* on the dielectric layer. The FINFET device 200 includes a semiconductor layer 201*a*-201*b* around the first and second fins 202*a*-202*b*, and a pair of gate stack layers 203-204.

SUMMARY

Generally speaking, a method for making a semiconductor device may comprise forming a plurality of fins above a substrate, each fin comprising an upper fin portion comprising a first semiconductor material and a lower fin portion comprising a dielectric material. The method may include forming recesses into sidewalls of each lower fin portion to expose a lower surface of a respective upper fin portion, and forming a second semiconductor layer surrounding the plurality of fins including the exposed lower surfaces of the upper fin portions. The second semiconductor layer may include a second semiconductor material to generate stress in the first semiconductor material. Advantageously, the semiconductor device may have increased carrier mobility.

In particular, the first semiconductor material may define a channel region of the semiconductor device. The forming of the recesses may comprise an isotropic etching of the dielectric material. The method may further comprise an anisotropic etching of the dielectric material subsequent to the isotropic etching.

For example, the forming of the second semiconductor layer may comprise an epitaxial process. The dielectric material may comprise silicon dioxide. The first semiconductor material may comprise silicon. The second semiconductor material may comprise silicon germanium.

Another aspect is directed to a semiconductor device. The semiconductor device may include a substrate, and a plurality of fins above the substrate, each fin comprising an upper fin portion comprising a first semiconductor material and a lower fin portion comprising a dielectric material. Each lower fin portion may have sidewalls defining recesses to expose a lower surface of a respective upper fin portion. The semiconductor device may include a second semiconductor layer surrounding the plurality of fins including the exposed lower surfaces of the upper fin portions. The second semiconductor layer may comprise a second semiconductor material to generate stress in the first semiconductor material.

BRIEF DESCRIPTION OF THE DRAWINGS

FIGS. 5A-5C are schematic diagrams of cross-sectional views along lines x-x', y-y', and z-z' of FIG. 2, respectively, illustrating the method for making a semiconductor device, according to the present disclosure.

FIGS. 6A-6C are schematic diagrams of cross-sectional views along lines x-x', y-y', and z-z' of FIG. 2, respectively, illustrating the method for making a semiconductor device, according to the present disclosure.

FIGS. 7A-7C are schematic diagrams of cross-sectional views along lines x-x', y-y', and z-z' of FIG. 2, respectively, illustrating the method for making a semiconductor device, according to the present disclosure.

FIGS. 8A-8C are schematic diagrams of cross-sectional views along lines x-x', y-y', and z-z' of FIG. 2, respectively, illustrating the method for making a semiconductor device, according to the present disclosure.

DETAILED DESCRIPTION

The present disclosure will now be described more fully hereinafter with reference to the accompanying drawings, in which embodiments of the disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Referring to FIGS. 2-8C, a method for making a semiconductor device 20 according to the present disclosure is now described. In FIGS. 3A-3C, the method includes forming a dielectric layer 22 comprising a dielectric material on a substrate 21. For example, the substrate 21 may comprise silicon, and the dielectric layer 22 may comprise silicon dioxide, which may be formed via an oxidation process or a silicon-on-nothing process. The substrate 21 may comprise a thinned buried oxide (BOX) substrate, i.e. a thin box. The method also includes forming a first semiconductor layer comprising a first semiconductor material on the dielectric layer 22. The first semiconductor material may comprise silicon, for example, and defines a plurality of rectangular boxes that respectively define a corresponding plurality of fins 23a-23b above the substrate 21. In particular, the first semiconductor material in the plurality of fins 23a-23b may define channel regions of the semiconductor device 20.

In other words, the semiconductor device 20 may provide a multi-gate semiconductor device, such as a FINFET device. In the illustrated embodiment, the semiconductor device 20 includes only two fins 23a-23b, but it should be appreciated that the semiconductor device may include many more fins.

Figure 1C:
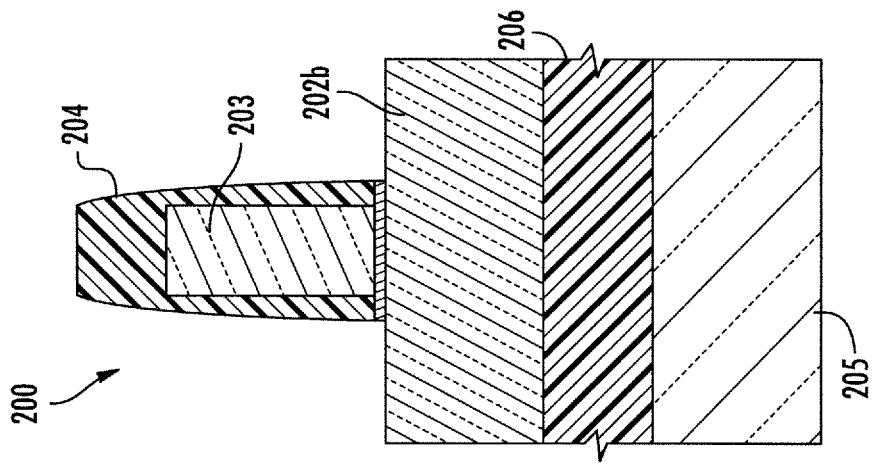
FIGS. 1A-1C are schematic diagrams of front, and first and second lateral cross-sectional views of a semiconductor device, according to the prior art.
Figure 1B:
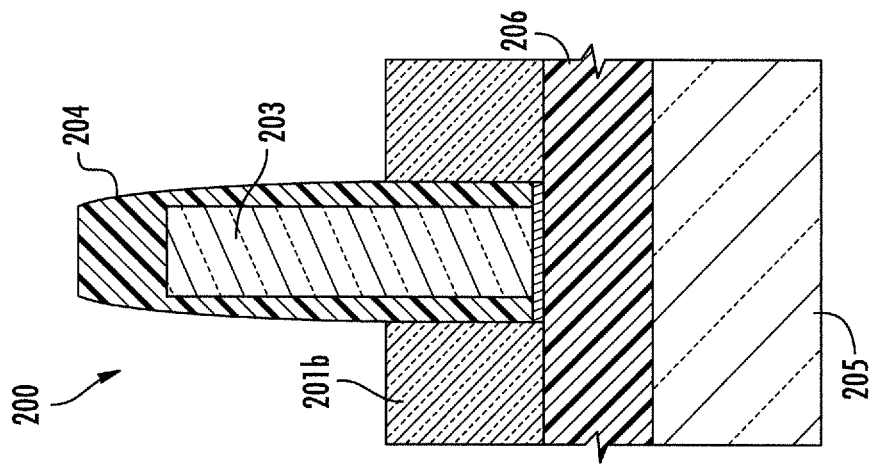
Figure 1A:
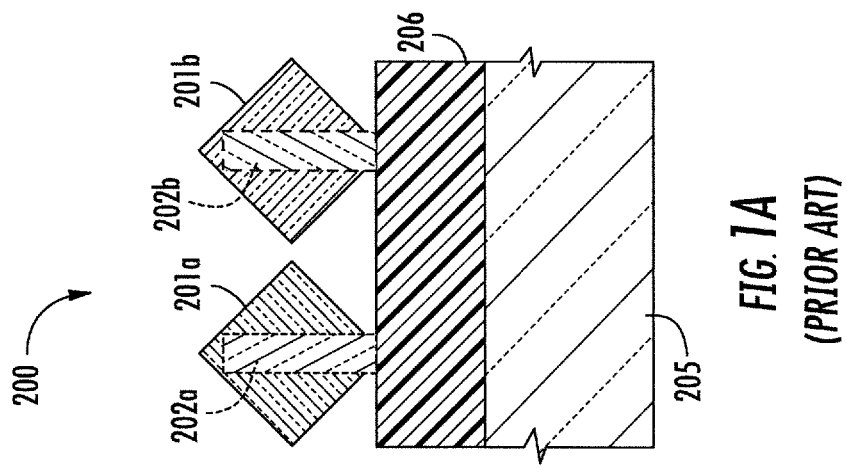
Figure 2:
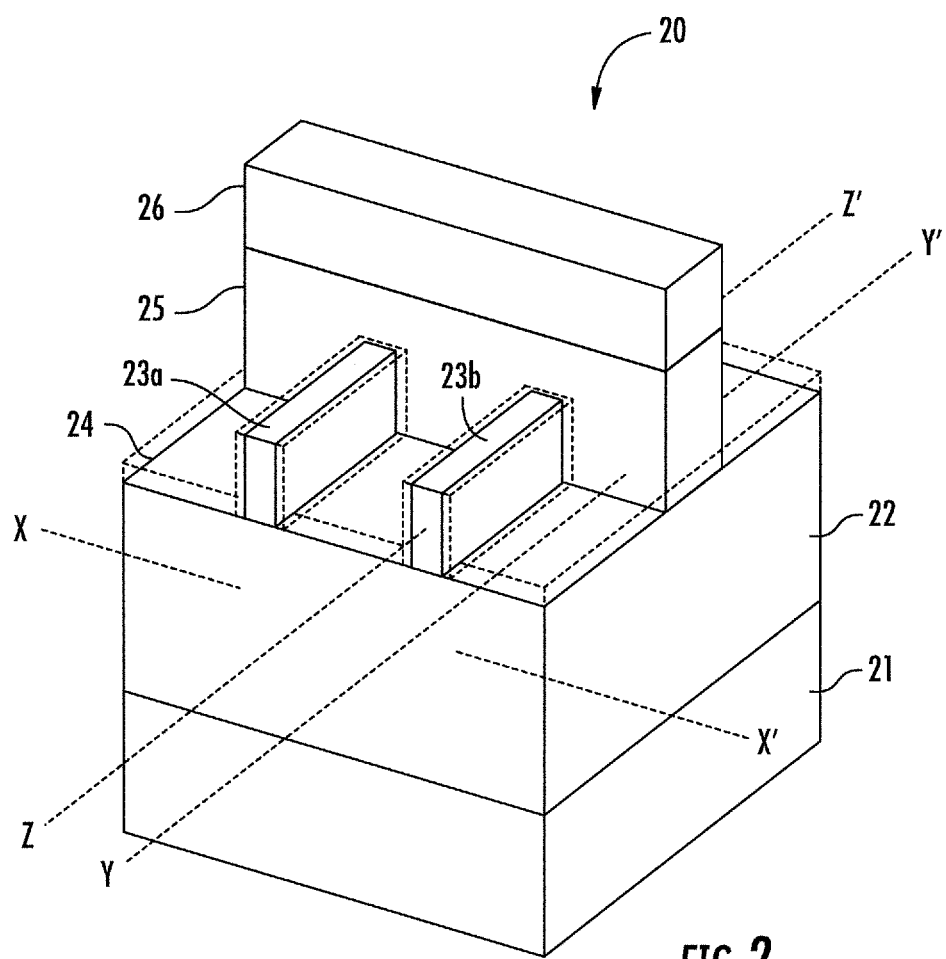
FIG. 2 is a perspective view of a semiconductor device, according to the present disclosure.
Figure 3A:
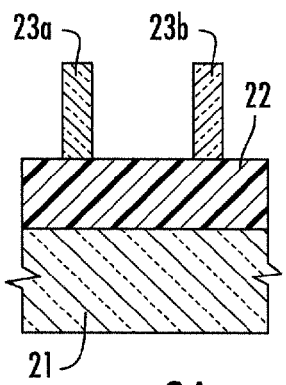
FIGS. 3A-3C are schematic diagrams of cross-sectional views along lines x-x', y-y', and z-z' of FIG. 2, respectively, illustrating a method for making a semiconductor device, according to the present disclosure.
Figure 3B:
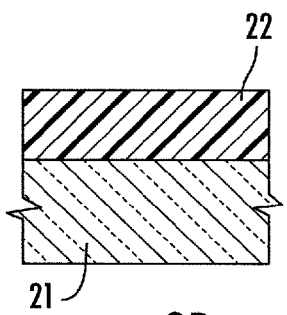
Figure 3C:
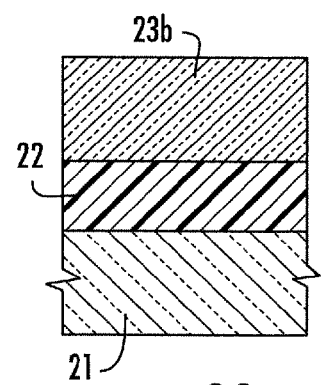
Figure 4A:
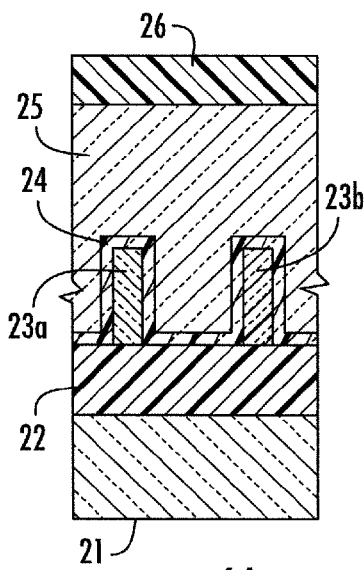
FIGS. 4A-4C are schematic diagrams of cross-sectional views along lines x-x', y-y', and z-z' of FIG. 2, respectively, illustrating the method for making a semiconductor device, according to the present disclosure.
Figure 4B:
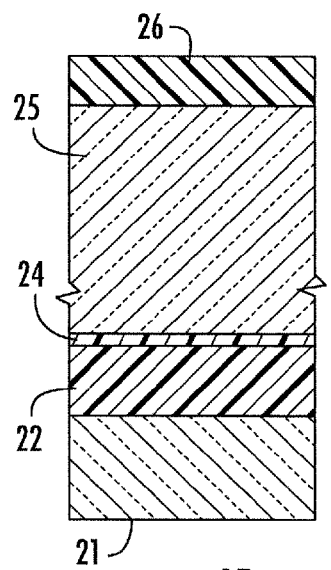
Figure 4C:
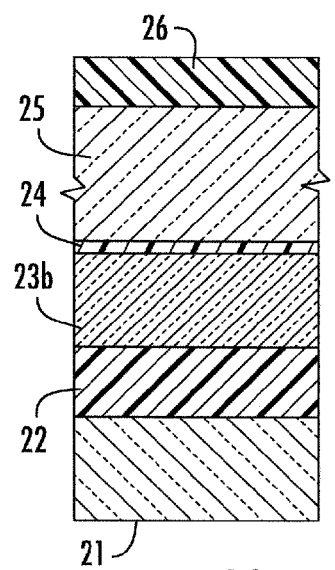

Referring now to FIGS. 4A-4C, the method illustratively includes forming a first sacrificial (dummy) layer 24 (depicted with dashed lines in FIG. 2) on the plurality of fins 23a-23b and the dielectric layer 22. The first sacrificial layer 24 may comprise oxide, for example. The method also includes forming a second sacrificial (dummy) layer 25 on the first sacrificial layer 24. The second sacrificial layer 25 may comprise polysilicon, for example. The method also illustratively includes forming a mask layer 26 on the second sacrificial layer 25. The mask layer 26 may comprise a hard mask layer material, such as silicon nitride, for example.

Referring now to FIGS. 5A-6C, the method illustratively includes a patterning step (e.g. photonic crystal laser patterning) for removing portions of the second sacrificial layer 25, and the mask layer 26. The method further includes forming first and second spacers 27 around the second sacrificial layer 25 and the mask layer 26, i.e. defining a gate stack area. The first and second spacers 27 may also comprise silicon nitride.

Referring now to FIGS. 7A-8C, the method illustratively includes selectively removing portions of the first sacrificial layer 24 and the dielectric layer 22. This removal step may define each fin 23a-23b comprising an upper fin portion 31a-31b comprising the first semiconductor material, and a lower fin portion 22a-22b comprising the dielectric material. In particular, this removal step may include forming recesses 32a-32b into sidewalls of each lower fin portion 22-22b to expose a lower surface of a respective upper fin portion 31a-31b. The recesses 32a-32b in the sidewalls of each lower fin portion 22-22b may have a sigma-shape, for example, but other shapes may also be used.

In some embodiments, the removal step may include forming the recesses 32a-32b by at least performing an isotropic etching of the dielectric material in the dielectric layer 22. The method may further comprise an anisotropic etching of the dielectric material subsequent to the isotropic etching.

The method also illustratively includes forming a second semiconductor layer 28 surrounding the plurality of fins 23a-23b including the exposed lower surfaces of the upper fin portions 31a-31b. The second semiconductor layer 28 may include a second semiconductor material different from the first semiconductor material to generate stress in the first semiconductor material. For example, the forming of the second semiconductor layer 28 may comprise an epitaxial process. For example, the second semiconductor material may comprise silicon germanium, which may advantageously enhance strain in the first semiconductor material. For example, the strain may comprise tensile strain or compressive strain. Helpfully, since the channel regions of the semiconductor device 20 are defined in the first semiconductor material in the plurality of fins 23a-23b, the strain causes increased carrier mobility therein.

In particular, the second semiconductor material may generate a crystalline lattice mismatch with the first semiconductor material, thereby providing strain based enhancement. Moreover, since the second semiconductor layer 28 has more volume than in typical approaches, the amount of strain created in the plurality of fins 23a-23b is increased. Also, the second semiconductor material has an increased amount of contact area with the first semiconductor material, compared to typical approaches. The semiconductor device 20 may use the advantage of thin box devices, i.e. in terms of excellent electrostatics and ease of controlling fin dimensions. Meanwhile, the semiconductor device 20 may benefit from the stress maximization advantage of bulk devices.

In some embodiments, the method may further include forming an interconnect layer, which may comprise a dielectric material, such as silicon dioxide. The method may include a first chemical-mechanical polishing (CMP) step, which removes the interconnect layer, stopping at the mask layer 26 of the gate stack. The method may include removing the mask layer 26, and the second sacrificial layer 25 in the gate stack. The method may include conformally depositing a high-k dielectric gate layer, and an electrically conductive gate layer (e.g. metallic material).

The method may include forming an electrically conductive material, such as tungsten, inside the gate area, and performing a second CMP step to remove excess electrically conductive material outside the gate area. Thus, the second CMP step uses the interconnect layer as a stop layer. The method may include etching back the high-k dielectric/metal gate layers.

The method may include depositing silicon nitride to fill the etched area. This is to seal the high-k dielectric/metal gate/tungsten inside the gate area. The method may include depositing another layer dielectric material, such as silicon dioxide. The method also may include patterning the contacts and etching the contacts to connect to source/drain areas, and forming silicide in source/drain areas. The method may include forming the contacts with an electrically conductive material, such as tungsten.

Another aspect is directed to a semiconductor device 20. The semiconductor device 20 may include a substrate 21, a plurality of fins 23a-23b above the substrate, each fin comprising an upper fin portion 31a-31b comprising a first semiconductor material and a lower fin portion 22a-22b comprising a dielectric material. Each lower fin portion 22a-22b may have sidewalls defining recesses 32a-32b to expose a lower surface of a respective upper fin portion 31a-31b. The semiconductor device 20 may include a second semiconductor layer 28 surrounding the plurality of fins 23a-23b including the exposed lower surfaces of the upper fin portions 31a-31b. The second semiconductor layer may comprise a second semiconductor material to generate stress in the first semiconductor material.

Figure 9:
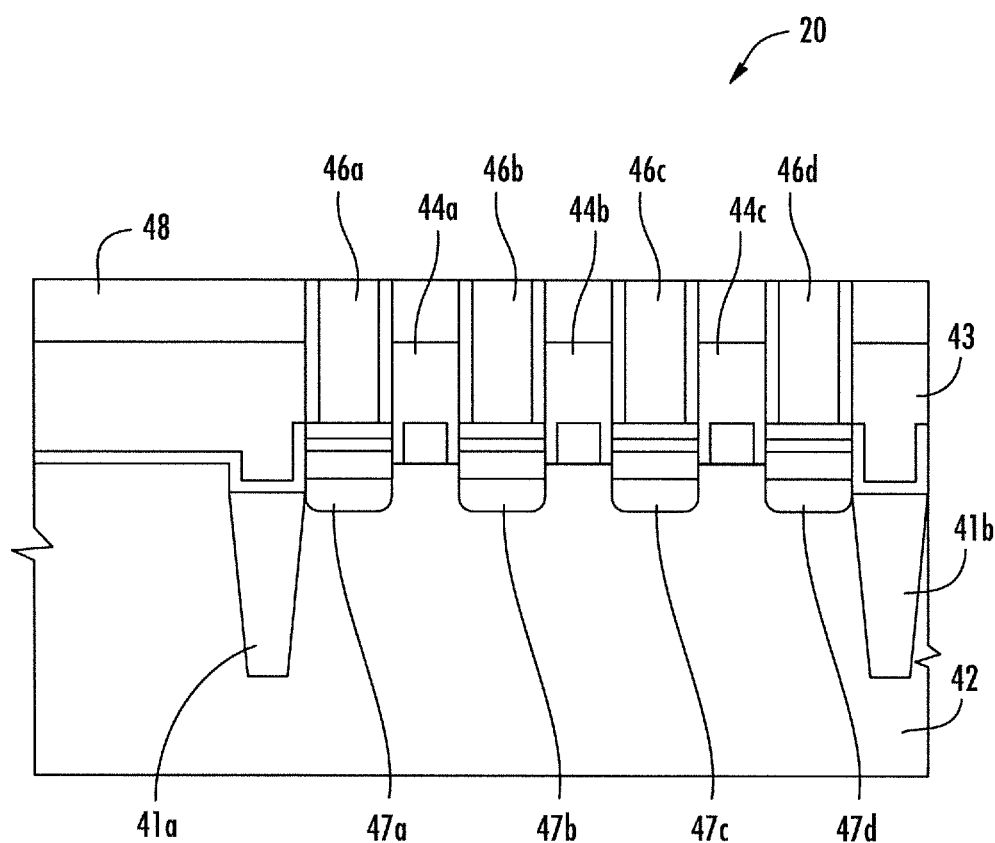
FIG. 9 is a schematic diagram of a cross-sectional view of a semiconductor device, according to the present disclosure.

Referring now to FIG. 9, an illustrative embodiment of the semiconductor device 20 is shown. The semiconductor device 20 illustratively includes a substrate 42, a plurality of shallow trench isolation (STI) regions 41a-41b in the substrate, a first layer 43 on the substrate, and a second layer 48 on the first layer. The semiconductor device 20 illustratively includes drain/source regions 47a-47d, and respective electrically conductive contacts 46a-46d coupled thereto. The semiconductor device 20 illustratively includes a plurality of gate stacks 44a-44c between the drain/source regions 47a-47d.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A semiconductor device comprising:
a substrate;
a plurality of fins above said substrate, each fin including an upper fin portion including a first semiconductor material and a lower fin portion including a dielectric material, the lower fin portion of each fin having sidewalls defining recesses extending inwardly and under a bottom surface of the first semiconductor material of the upper fin portion of the fin;
a semiconductor layer directly on said plurality of fins including on the bottom surfaces of the first semiconductor material of the upper fin portions, the semiconductor layer including a second semiconductor material that contacts the bottom surfaces of the first semiconductor material of the upper fin portions and contacts and generates stress in the first semiconductor material from two opposite outermost sidewalls of an upper fin portion of the upper fin portions; and
a gate electrode structure over a fin of the plurality of fins, the gate electrode structure including a gate electrode spacer under which the semiconductor layer at least partially extends;
wherein the two opposite outermost sidewalls of the upper fin portion are each oriented substantially along a direction of a gate length of the gate electrode structure.

2. The semiconductor device of claim 1 wherein said first semiconductor material defines a channel region.

3. The semiconductor device of claim 1 wherein said semiconductor layer comprises an epitaxial layer.

4. The semiconductor device of claim 1 wherein said dielectric material comprises silicon dioxide.

5. The semiconductor device of claim 1 wherein said first semiconductor material comprises silicon.

6. The semiconductor device of claim 5 wherein said second semiconductor material comprises silicon germanium.

7. The semiconductor device of claim 1 wherein the semiconductor device is a fin-based field effect transistor (FINFET).

8. A semiconductor device comprising:
a substrate;
a fin above the substrate, the fin including an upper fin portion including a first semiconductor material and a lower fin portion including a dielectric material, the lower fin portion having a sidewall defining a recess abutting a bottom surface of the first semiconductor material of the upper fin portion, the bottom surface being transverse to the sidewall; and
a semiconductor portion directly on the fin and contacting the bottom surface of the first semiconductor material of the upper fin portion within the recess and contacting and generating stress in the first semiconductor material from two opposite outermost sidewalls of the upper fin portion, the two opposite outermost sidewall being oriented substantially along a direction of charge carrier movement, the semiconductor portion including a second semiconductor material different than the first semiconductor material.

9. The semiconductor device of claim 8 wherein the second semiconductor material comprises silicon germanium, and the first semiconductor material comprises silicon.

10. The semiconductor device of claim 8 wherein the second semiconductor material comprises silicon germanium.

11. The semiconductor device of claim 8 wherein the first semiconductor material comprises silicon.

12. The semiconductor device of claim 8 wherein the semiconductor device is a fin-based field effect transistor (FINFET); and wherein the semiconductor portion defines part of a source region of the FINFET.

13. The semiconductor device of claim 8 wherein the semiconductor device is a fin-based field effect transistor (FINFET); and wherein the semiconductor portion defines part of a drain region of the FINFET.

14. The semiconductor device of claim 8 comprising a gate electrode structure over the fin, the gate electrode structure including a gate electrode spacer; wherein the semiconductor portion extends at least partially under the gate electrode spacer.

15. A semiconductor device comprising:
a substrate;
a fin above the substrate and including an upper fin portion including a first semiconductor material and a lower fin portion including a dielectric material, the lower fin portion having a sidewall defining a first recess abutting a bottom surface of the first semiconductor material of the upper fin portion, the bottom surface being transverse to the sidewall;
a semiconductor portion on the upper fin portion and contacting the bottom surface of the first semiconductor material of the upper fin portion within the first recess and two opposite outermost sidewalls of the upper fin portion, the semiconductor portion including a second semiconductor material; and
a gate electrode structure including a gate electrode spacer under which the semiconductor portion at least partially extends;
wherein the two opposite outermost sidewalls of the upper fin portion are each oriented substantially along a direction of a gate length of the gate electrode structure.

16. The semiconductor device of claim 15, further comprising a dielectric layer under the gate electrode structure, wherein the semiconductor portion abuts a bottom surface of the gate electrode spacer within a second recess formed in the dielectric layer.

17. The semiconductor device of claim 15 wherein the second semiconductor material is different than the first semiconductor material.

18. The semiconductor device of claim 15 wherein the second semiconductor material comprises silicon germanium, and the first semiconductor material comprises silicon.

19. The semiconductor device of claim 15 wherein the second semiconductor material comprises silicon germanium.

20. The semiconductor device of claim 15 wherein the first semiconductor material comprises silicon.

* * * * *